United States Patent
Seo et al.

(10) Patent No.: US 7,091,116 B2
(45) Date of Patent: Aug. 15, 2006

(54) METHODS OF MANUFACTURING SEMICONDUCTOR DEVICES

(75) Inventors: Byoung Yoon Seo, Kyounggi-do (KR); Teresa Lim, Jeju-Do (KR)

(73) Assignee: Dongbu Electronics, Co., Ltd., Seoul (KR)

(*) Notice: Subject to any disclaimer, the term of this patent is extended or adjusted under 35 U.S.C. 154(b) by 0 days.

(21) Appl. No.: 10/746,805

(22) Filed: Dec. 26, 2003

(65) Prior Publication Data
US 2004/0142514 A1  Jul. 22, 2004

(30) Foreign Application Priority Data
Dec. 28, 2002 (KR) .................. 10-2002-0085878

(51) Int. Cl.
  *H01L 21/425* (2006.01)
(52) U.S. Cl. .................. 438/532; 438/592; 438/664
(58) Field of Classification Search ........ 438/197, 438/199, 299, 682, 683, 592, 532, 664
See application file for complete search history.

(56) References Cited

U.S. PATENT DOCUMENTS

| | | | | |
|---|---|---|---|---|
| 6,001,738 A | | 12/1999 | Lin et al. ................ 438/683 |
| 6,025,267 A | * | 2/2000 | Pey et al. ................ 438/656 |
| 6,160,299 A | | 12/2000 | Rodder .................... 257/408 |
| 6,436,747 B1 | * | 8/2002 | Segawa et al. .......... 438/197 |
| 6,534,402 B1 | | 3/2003 | Liao ........................ 438/659 |
| 6,765,269 B1 | * | 7/2004 | Lee et al. ................ 257/383 |
| 2004/0074872 A1 | * | 4/2004 | Chen et al. .............. 216/97 |

* cited by examiner

*Primary Examiner*—Tuan H. Nguyen
(74) *Attorney, Agent, or Firm*—Saliwanchik, Lloyd & Saliwanchik

(57) ABSTRACT

Disclosed is an example method of manufacturing a semiconductor device. The disclosed example method includes depositing a gate insulating layer on an active region of a self aligned silicide (salicide) region and a non-self aligned silicide (salicide) region of a semiconductor substrate, forming a gate electrode, a poly crystal silicon layer, on the gate insulating layer of the self aligned silicide (salicide) region, and forming a spacer on both sidewalls of the gate electrode. The example method may further include depositing a silicide shielding layer on the gate insulating layer to cover the gate electrode and the spacer, forming a photoresist on the silicide shielding layer of the non-self aligned silicide (salicide) region, removing the silicide shielding layer of the self aligned silicide (salicide) region to expose the gate electrode, and performing an ion-implantation to render the poly crystal silicon layer of the gate electrode amorphous, without removing the photoresist on the silicide shielding layer of the non-self aligned silicide (salicide) region. The example method may further include removing the photoresist on the silicide shielding layer of the non-self aligned silicide (salicide) region and cleaning the semiconductor substrate and depositing a metal layer for forming a silicide layer and forming the silicide layer on the gate electrode of the self aligned silicide (salicide) region by annealing the semiconductor device.

3 Claims, 6 Drawing Sheets

METHODS OF MANUFACTURING SEMICONDUCTOR DEVICES

TECHNICAL FIELD

The present disclosure relates to semiconductors and, more particularly, to methods of manufacturing semiconductor devices.

BACKGROUND

Generally, as the level of semiconductor device integration increases, it is desirable to refine a design rule for the semiconductor device to increase the operation speed of the device. However, as sizes of gate and source/drain electrodes of a metal oxide semiconductor (MOS) transistor are reduced accordingly, sheet resistance and contact resistance of the device increases. Previously, sheet and contact resistances were of little concern.

To solve this problem of increase sheet and contact resistances, a technology for forming a silicide of high fusion point metal with a low specific resistance in the gate electrode and the source/drain has been developed. As a result, a resistance of the gate electrode and a contact resistance of the source/drain were considerably reduced. In the past, the formation processes for silicide in the gate electrode and the source/drain were separately performed. The separation of these processes resulted in a complicated process having increased manufacturing costs. However, in the present, in consideration with a simplification of the manufacturing process and a cost reduction, a single formation process for silicide layer on the gate electrode and the source/drain, i.e., a Self Aligned Silicide (Salicide) process, was developed.

In the Salicide process, when a high fusion metal is deposited simultaneously on a silicon layer and an insulating layer and the high fusion metal is annealed, the high fusion metal on the silicon layer is reacted into a silicide through a silicide reaction whereas the high fusion metal on the insulating layer remains as it is without the silicide reaction. Then, the unreacted high fusion metal is removed, so that the silicide layer is left only on the silicon layer.

Meanwhile, in a non-salicide region for a resistance and an Electro-Static Discharge (ESD) shielding circuit of the semiconductor device, an insulating layer for preventing the deposition of high fusion metal is deposited.

The salicide process has been newly used for the formation process for silicide, instead of a conventional chemical vapor deposition (CVD) process that has been adapted to the manufacturing process for MOS transistor. Particularly, a titanium salicide process having an excellent characteristic for electric resistance of metal and for electric resistance of silicide had been adapted to the manufacturing process of MOS transistor.

According to the conventional method of manufacturing a semiconductor device, as shown in FIG. 1, an insulating layer for isolation (not shown) is formed on a field region (not shown) of a semiconductor substrate to define an active region of the semiconductor substrate 10, formed of such as, for example, a P type single crystal silicon material. Herein, the semiconductor substrate 10 is classified into a salicide region 11 and a non-salicide region 12.

Successively, a gate insulating layer 13 of MOS transistor is formed on the active region of the semiconductor substrate 10, and a pattern of a poly crystal silicon layer for a gate electrode 15 is formed on a gate electrode formation region of the gate insulating layer 13. Then, although not shown in the drawing, using the gate electrode 15 as a mask for the formation of a lightly doped drain (LDD) region, N type impurities, for example, phosphorous, are lightly ion-doped into the active region of the semiconductor substrate 10. Then, an insulating layer, for example, a spacer 17 of a nitride layer is formed on both sidewalls of the gate electrode 15. Successively, using the gate electrode 15 and the spacer 17 as an implantation mask, the impurities for the source/drain (not shown), for example, the N type impurities are heavily ion-doped into the active region of the semiconductor substrate 10.

Successively, to prevent the formation of silicide layer on the non-salicide region 12 upon the formation of silicide layer on the salicide region 11, an insulating layer is formed only on the non-salicide region 12. Explaining this with reference to FIGS. 2 and 3, an oxide layer 19 as a silicide shielding layer is deposited on the whole surface of the semiconductor substrate 10 to cover the gate electrode 15 and the spacer 17, by use of, for example, a low pressure TEOS CVD process. Then, a photoresist 21 to be used as an etching mask of the oxide layer 19 is formed on the oxide layer 19 of the non-salicide region 12. Thus, as shown in FIG. 3, using the photoresist 21 as an etching mask, the oxide layer 19 is isotropically etched by a wet etching process thus to expose an upper surface of the gate electrode 15 and also to leave the oxide layer 19 only on the non-salicide region 12. Herein, it is preferable that the oxide layer 19 is not left on an upper portion of the spacer 17 of the salicide region 11.

As shown in FIG. 4, the photoresist 21 is removed to expose the oxide layer 19 of the non-salicide region 12. Then, the N type impurities, for example, arsenic (As) ions, are implanted into the whole area of the semiconductor substrate 10 by using a Pre-Amorphization-Implant (PAI) process to easily perform a salicide process on the poly crystal silicon layer of the gate electrode 15.

As shown in FIG. 5, the surface of the semiconductor substrate 10 is cleaned by a cleaning solution such as dilute hydrogen fluoride (DHF), removing contaminants remaining in the surface of the semiconductor substrate 10. Then, using a sputtering process, a Ti/TiN layer 23 is deposited on the whole area of the semiconductor substrate 10.

As shown in FIG. 6, the Ti/TiN layer 23 is annealed. Herein, since the Ti/TiN layer 23 on the gate electrode 15 causes a salicide reaction, a silicide layer 25 is formed only on the gate electrode 15. Of course, although not shown in the drawing, the silicide layer is also formed on the source/drain of the salicide region 11. However, the Ti/TiN layer 23 on the other region does not cause a salicide reaction, so that the Ti/TiN layer 23 is left without reacting.

Finally, the unreacted Ti/TiN layer 23 is removed by wet-etching process, so that the silicide layer 25 is left only on the gate electrode 15.

However, in prior approaches, because the oxide layer 19 of the non-salicide region 12 is exposed, arsenic (As) ions are implanted into the oxide layer 19 of the non-salicide region 12 as well as the gate electrode 15, using the PAI process. As a result, the etching rate of the oxide layer 19 of the non-salicide region 12 is rather increased after the PAI process.

Accordingly, when the semiconductor substrate 10 is cleaned before the deposition of the Ti/TiN layer 23, the oxide layer 19 and the gate insulating layer 13 are completely etched on a part A of the non-salicide region 12, possibly exposing the active region of non-salicide region of the semiconductor substrate 10 beneath the oxide layer and the gate insulating layer.

In this state, if the salicide process is performed, the oxide layer 19 hardly serves as a silicide shielding layer, so that an unwanted silicide layer 27 may be formed on the part A of the non-salicide region 12 of the semiconductor substrate 10, which degrades an electric characteristic of the semiconductor device.

DETAILED DESCRIPTION

Figure 1:
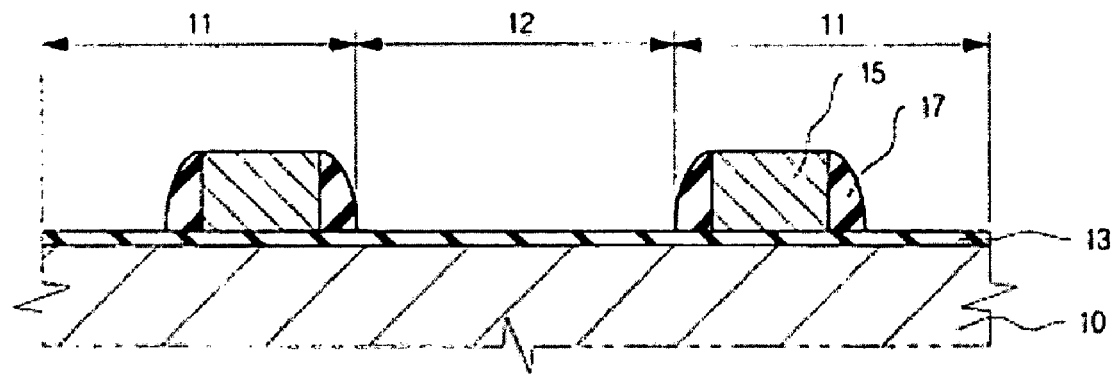
FIGS. 1 to 6 are cross sectional views showing the results of various procedures of a known method of forming a silicide layer.
Figure 2:
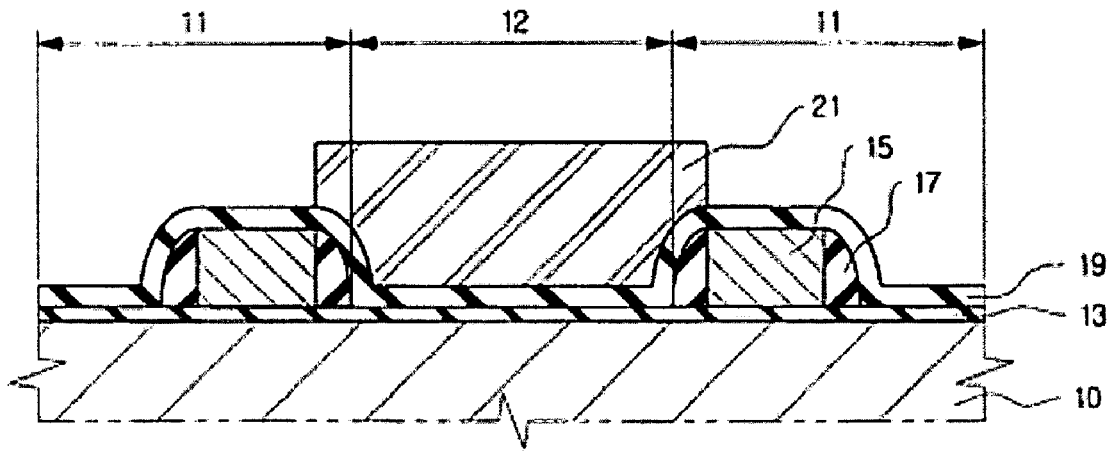
Figure 3:
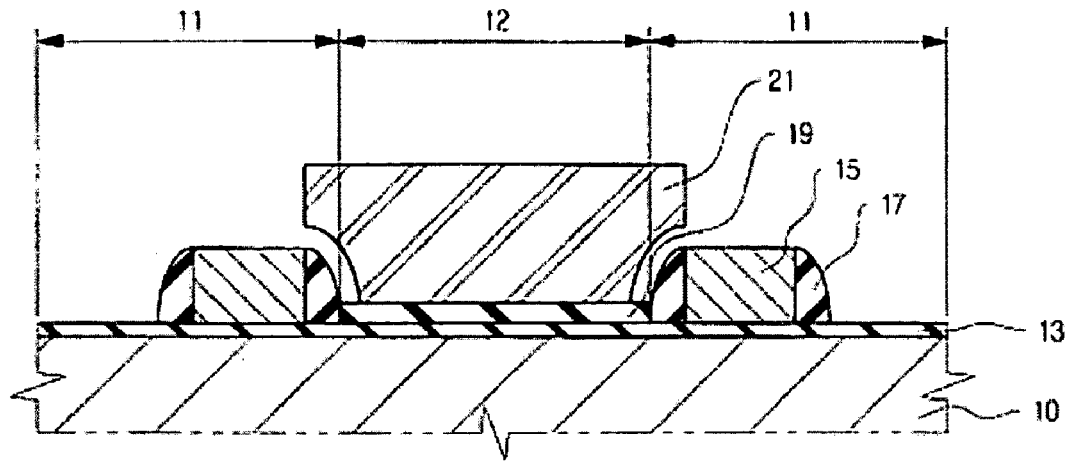
Figure 4:
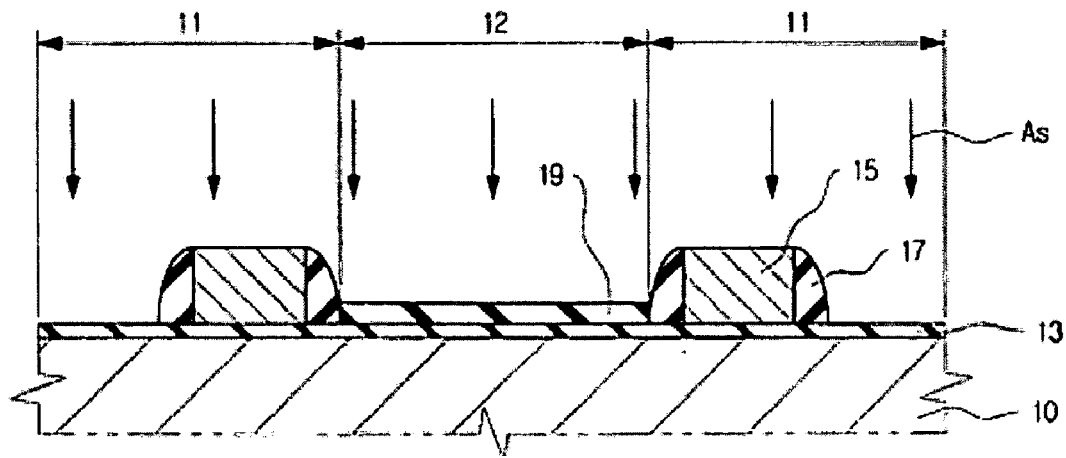
Figure 5:
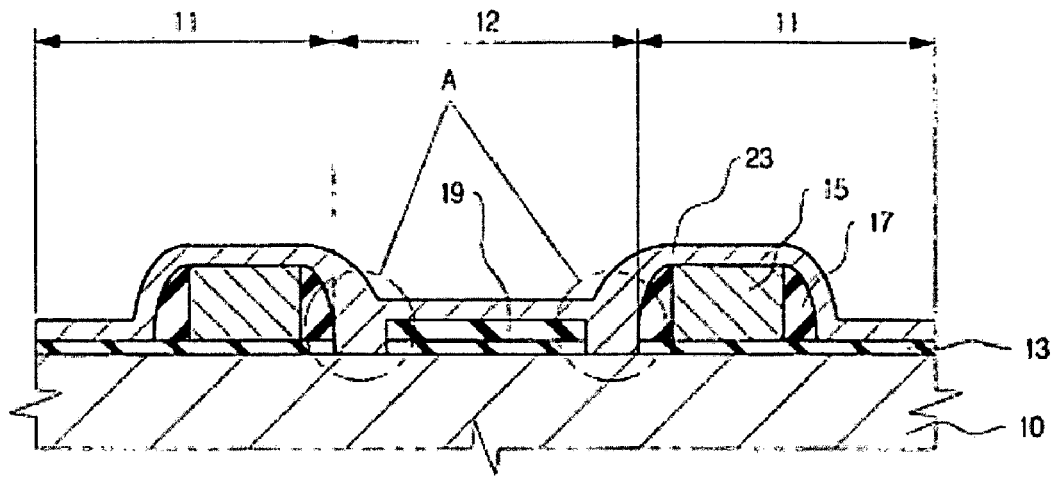
Figure 6:
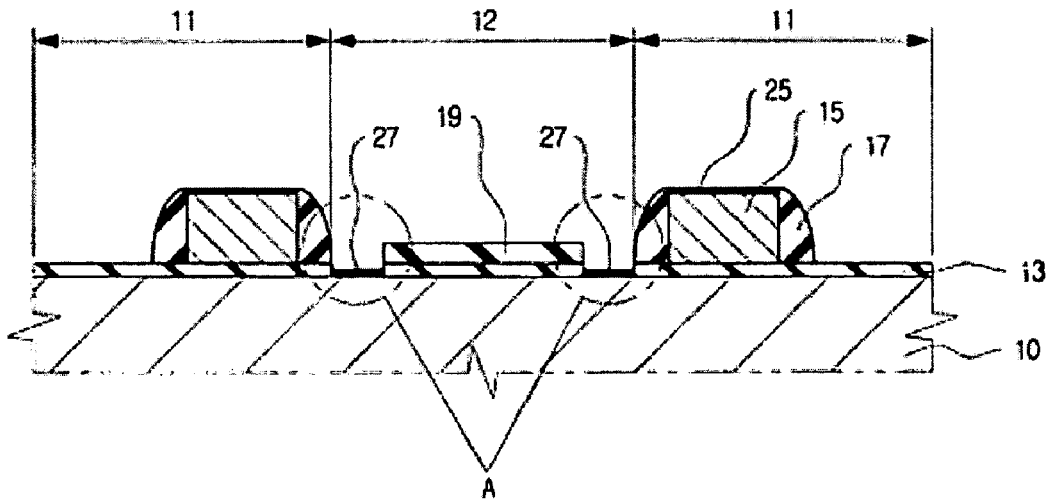
Figure 7:
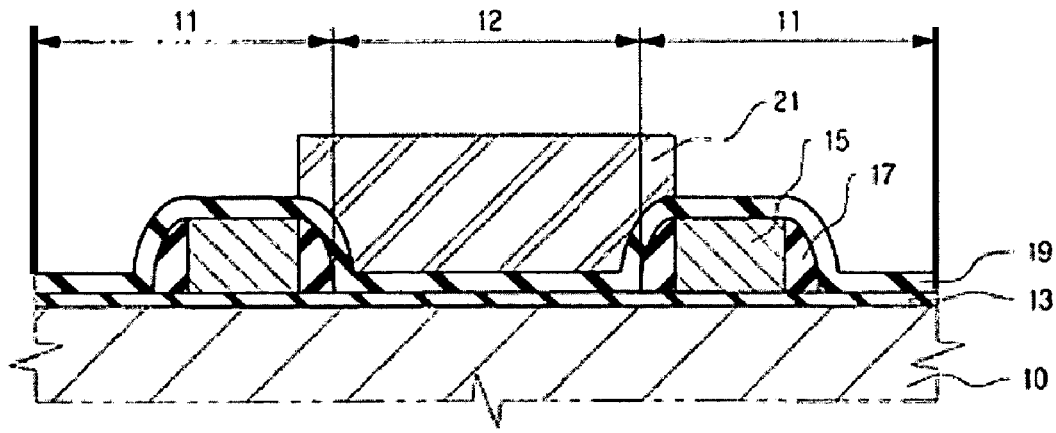
FIGS. 7 to 12 are cross sectional views showing the results of various procedures of an example method of manufacturing a semiconductor device adapting a salicide process.

Referring to FIG. 7, an insulating layer for isolation (not shown) is formed on a field region (not shown) of a semiconductor substrate in order to define an active region of the semiconductor substrate 10, formed of such as, for example, a P type single crystal silicon material. Herein, the semiconductor substrate 10 is classified into a salicide region 11 and a non-salicide region 12. Successively, a gate insulating layer 13 of a MOS transistor, for example, an oxide layer, is formed in a thickness of 100 Å on the salicide region 11 of the semiconductor substrate 10.

Then, a conductive layer for forming a gate electrode 15, for example, a poly crystal silicon layer, is deposited in a thickness of 2000 to 3000 Å on the gate insulating layer 13 of the salicide region. Herein, the poly crystal silicon layer is deposited by CVD process and doped simultaneously, or the poly crystal silicon layer can be doped by an ion-implantation process after being deposited. Successively, using a photolithography process, the gate electrode 15 is formed on a gate electrode formation region of the gate insulating layer 13. Then, although not shown in the drawing, using the gate electrode 15 as a mask for the formation of a lightly doped drain (LDD) region, N type impurities, for example, phosphorous, are lightly ion-doped into the active region of the semiconductor substrate 10.

Subsequently, an insulating layer for forming the spacer 17, for example, a nitride layer having a high etching selectivity relative to etching selectivity of the gate insulating layer 13, is deposited in a thickness of 700 to 900 Å on the whole area of the semiconductor substrate 10 including the gate electrode 15 and the gate insulating layer 13, and the insulating layer for forming the spacer 17 is etched using an etch back process having an isotropic feature until the poly crystal silicon layer of the gate electrode 15 is exposed. Then, accordingly, the spacer 17 is formed on both sidewalls of the gate electrode 15. Successively, using the gate electrode 15 and the spacer 17 as an implantation mask, the impurities for the source/drain (not shown), for example, the N type impurities are ion-doped into the active region of the semiconductor substrate 10.

Then, an oxide layer 19 as a silicide shielding layer is deposited in a thickness of 1000 to 2000 Å on the whole surface of the semiconductor substrate 10 including the gate electrode 15 and the spacer 17, by use of, for example, a low pressure tetra ethyl ortho silicate (TEOS) chemical vapor deposition (CVD) process. Then, an etching mask of the oxide layer 19, for example, a photoresist 21 is formed on the oxide layer 19 of the non-salicide region 12.

Figure 8:
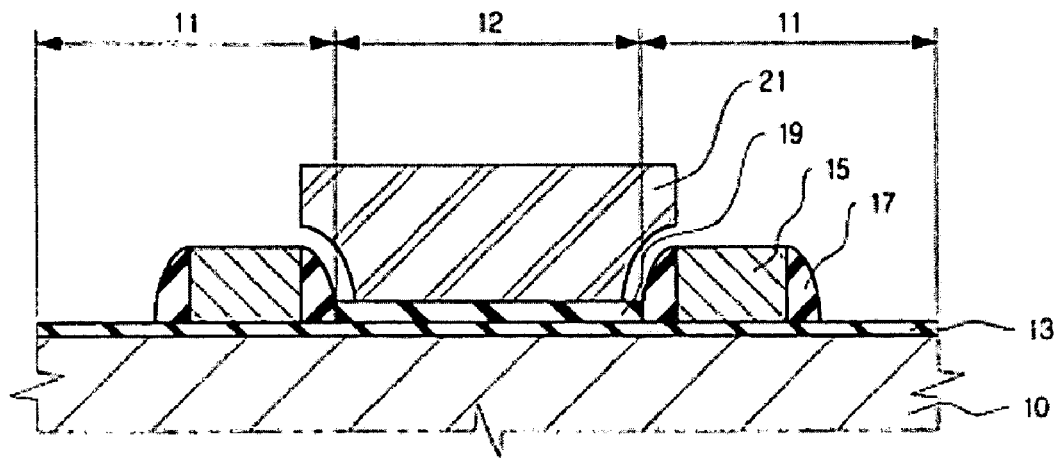

As shown in FIG. 8, using the photoresist 21 as an etching mask, the oxide layer 19 is isotropically etched by a wet etching process thus to expose an upper surface of the gate electrode 15 and also to leave the oxide layer 19 only on the non-salicide region 12. Herein, it is preferable that the oxide layer 19 is not left on an upper portion of the spacer 17 of the salicide region 11.

Figure 9:
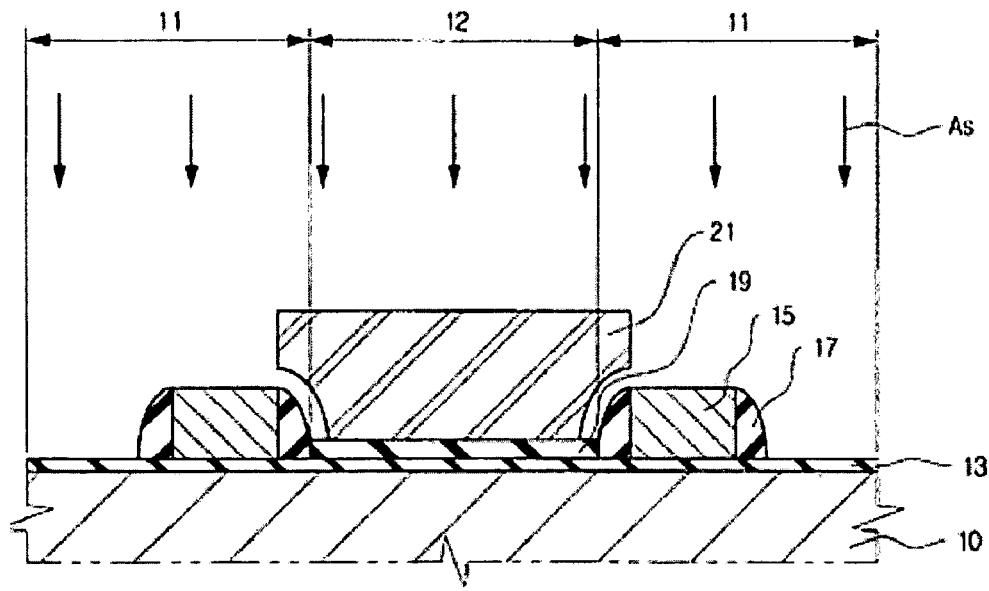

As shown in FIG. 9, the N type impurities, for example, arsenic (As) ions, are implanted into the whole area of the semiconductor substrate 10, without removing the photoresist 21, by a Pre-Amorphization-Implant (PAI) process, in order to easily perform a salicide process on the poly crystal silicon layer of the gate electrode 15. Herein, since the photoresist serves as an implantation mask, contrary to the prior art, the arsenic (As) ions are not implanted into the oxide layer 19 of the non-salicide region 12. As a result, the etching rate of the oxide layer 19 is maintained constant irrespective of whether the PAI process is performed.

Figure 10:
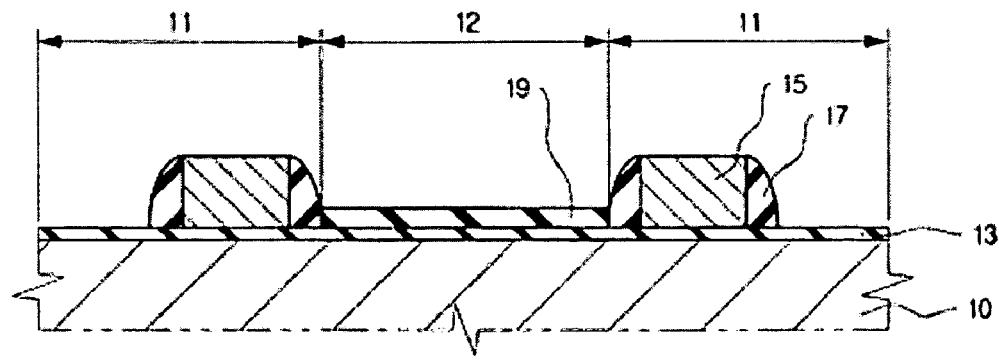

As shown in FIG. 10, then, the photoresist 21 is removed. Then, the surface of the semiconductor substrate 10 is cleaned by using a cleaning solution such as DHF solution, thereby removing contaminants on the surface of the semiconductor substrate 10.

Herein, since the etching rate of the oxide layer 19 is maintained constant irrespective of whether the PAI process is performed, the oxide layer 19 of the non-salicide region 12 is not completely etched, so that the oxide layer 19 of the non-salicide region 12 is left in a desired thickness. Thus, in the non-salicide region 12, the active region of the substrate 10 is not exposed at all.

Simultaneously, in one example, the gate insulating layer on the source/drain is also wet-etched so as to expose the surface of the source/drain (not shown) for MOS transistor of the salicide region 11. This aims to form a silicide layer 25 on the gate electrode 15 and also on the source/drain.

Figure 11:
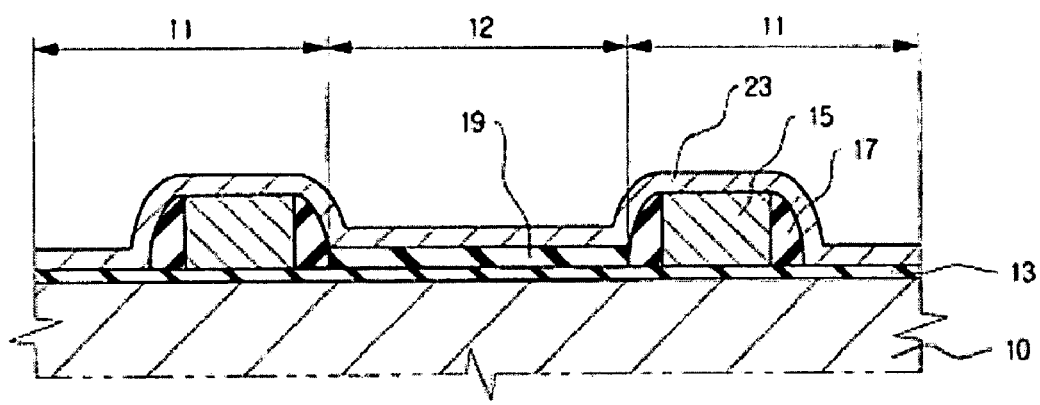

As shown in FIG. 11, then, using, for example, a sputtering process, a Ti/TiN layer 23 is deposited on the whole area of the semiconductor substrate 10 to cover the spacer 17, the gate electrode 15 and the oxide layer 19 of the non-salicide region 12. Herein, the Ti/TiN layer 23 of the non-salicide region 12 cannot make a direct contact with the active region of the semiconductor substrate 10 of the non-salicide region 12 due to the oxide layer 19 of the non-salicide region 12.

Figure 12:
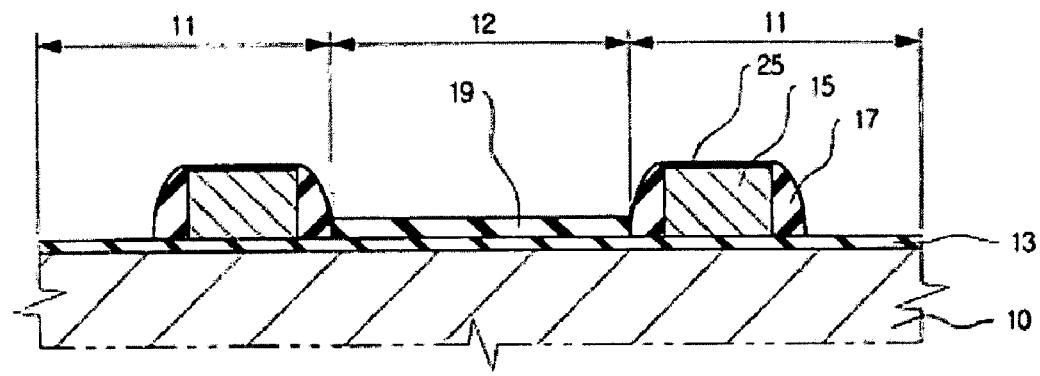

As shown in FIG. 12, then, using a conventional annealing process, the Ti/TiN layer 23 is annealed at a temperature of, for example, 700 to 800° C. Herein, the Ti/TiN layer 23 on the surfaces of the source/drain (not shown) and the gate electrode 15 of the salicide region 11 causes a salicide reaction while the Ti/TiN layer 23 on the other region does not cause a salicide reaction. Accordingly, the silicide layer 25 is formed on an upper surface of the source/drain (not shown) and the gate electrode of the salicide region 11.

Finally, the unreacted Ti/TiN layer 23 of the non-salicide region 12 is wet-etched using, for example, an ammonia solution, thus completing the manufacturing procedure of the present invention.

Thus, as disclosed herein, the silicide layer is not generated on the non-salicide region of the semiconductor substrate, but only on the gate electrode and the source/drain of the salicide region. As a result, reliability of the salicide process is improved and the degradation of the characteristic of the semiconductor device is prevented.

As described above, there is provided an example method of manufacturing the semiconductor device, wherein the gate electrode is formed on the active region of the salicide region of the semiconductor substrate, the spacer is formed on the sidewalls of the gate electrode, the oxide layer as the silicide shielding layer is deposited on the whole area of the semiconductor substrate, the photoresist is formed on the non-salicide region using the photolithography process, and the oxide layer on the salicide region is removed while the oxide layer is left on the non-salicide region. The arsenic (As) ions are implanted into the gate electrode using PAI process without removing the photoresist on the non-salicide region. Then, the photoresist is removed and the surface of the semiconductor substrate is cleaned.

Accordingly, since the oxide layer on the non-salicide region is masked by the photoresist upon the implantation of As ions into the gate electrode using PAI process, the etching rate of the oxide layer of the non-salicide region is constant irrespective of whether the PAI process is performed. As a result, although the semiconductor substrate is cleaned after the removal of the photoresist, the surface of the semiconductor substrate of the non-salicide region is not exposed.

Thus, the silicide layer is generated not on the non-salicide region of the semiconductor substrate, but on the gate electrode and the source/drain of the salicide region, which may prevent the degradation of the characteristic of the semiconductor device and may improve the reliability of the salicide process.

Although certain example methods are disclosed herein, the scope of coverage of this patent is not limited thereto. On the contrary, this patent covers every apparatus, method and article of manufacture fairly falling within the scope of the appended claims either literally or under the doctrine of equivalents.

What is claimed is:

1. A method of manufacturing a semiconductor device, comprising:

depositing a gate insulating layer on an active region of a self aligned silicide (salicide) region and a non-self aligned silicide (salicide) region of a semiconductor substrate;

forming a gate electrode, a poly crystal silicon layer, on the gate insulating layer of the self aligned silicide (salicide) region;

forming a spacer on both sidewalls of the gate electrode;

depositing a suicide shielding layer on the whole surface of the semiconductor substrate including the gate electrode and spacer;

forming a photoresist on the silicide shielding layer of the non-self aligned silicide(salicide) region;

removing the silicide shielding layer of the self aligned silicide(salicide) region by isotropic wet etching to expose an upper surface of the gate electrode and a portion of the spacer and to leave the silicide shielding layer in the area between the gate electrodes;

performing a pre-amorphization ion-implantation to render the poly crystal silicon layer of the gate electrode amorphous, without removing the photoresist on the silicide shielding layer of the non-self aligned silicide (salicide) region, not to implant ions into the silicide shielding layer of the non-self aligned silicide(salicide) region;

removing the photoresist on the silicide shielding layer of the non-self aligned silicide (salicide) region and cleaning the semiconductor substrate; and depositing a metal layer for forming a silicide layer over the whole surface of the semiconductor substrate and then forming the silicide layer only on the gate electrode of the self aligned silicide (salicide) region by annealing the semiconductor device.

2. A method as defined by claim 1, wherein the silicide shielding layer is formed of an oxide layer.

3. A method as defined in claim 1, wherein the metal layer is Ti/TiN.

* * * * *